United States Patent
Van Den Brink et al.

(10) Patent No.: US 6,331,777 B1
(45) Date of Patent: Dec. 18, 2001

(54) MAGNETIC RESONANCE METHOD AND DEVICE

(75) Inventors: Johan S. Van Den Brink; Arianne M. C. Van Muiswinkel, both of Eindhoven (NL)

(73) Assignee: U.S. Philips Corporation, New York, NY (US)

(*) Notice: Subject to any disclaimer, the term of this patent is extended or adjusted under 35 U.S.C. 154(b) by 0 days.

(21) Appl. No.: 09/447,548

(22) Filed: Nov. 23, 1999

(30) Foreign Application Priority Data

Nov. 25, 1998 (EP) .................................................. 98203985

(51) Int. Cl.[7] .................................................. G01V 3/00
(52) U.S. Cl. .......................................... 324/312; 324/307
(58) Field of Search ..................................... 324/306, 307, 324/309, 300, 312, 314; 600/419, 420, 421

(56) References Cited

U.S. PATENT DOCUMENTS 6,057,686 * 5/2000 Van Den Brink et al. .......... 324/309
6,076,006 * 6/2000 Van Den Brink et al. .......... 600/419
6,118,273 * 9/2000 Takizawa et al. .................... 324/309

OTHER PUBLICATIONS

"The Use of Intelligent Re-Acquisition to Reduce Scan Time in MRI Degraded by Motion", by Q. Nguyen et al., Society of Magnetic Resonance in Medicine, Meeting Apr. 1998, p. 134 (XP-000861748).

* cited by examiner

Primary Examiner—Louis Arana
(74) Attorney, Agent, or Firm—John F. Vodopia

(57) ABSTRACT

The invention relates to a magnetic resonance imaging method. The method includes the execution of image pulse sequences for the measurement of magnetic resonance image signals and navigator signals. After the execution of the image pulse sequence, the navigator MR signal is checked so as to determine whether the navigator MR signal meets a predetermined quality criterion. If the navigator MR signal does not meet the quality criterion, the navigator MR signal and the magnetic resonance imaging signals corresponding to the navigator MR signal are measured again.

10 Claims, 2 Drawing Sheets

MAGNETIC RESONANCE METHOD AND DEVICE

BACKGROUND OF THE INVENTION

1. Field of the Invention

The invention relates to a method of forming a magnetic resonance image of an object which is arranged in a steady magnetic field, which method involves repeated execution of an image pulse sequence and includes the following steps: signals are measured along a first number of lines in the k-space by application of gradients, the method also including the following steps:

2. Description of the Related Art

MR image. The invention also relates to a device for carrying out such a method.

In the context of the present patent application a gradient is to be understood to mean a magnetic field gradient of the steady magnetic field.

The method of the kind set forth is known from the article "The Use of Intelligent Re-acquisition to Reduce Scan Time in MRI degraded by Motion", Q. Nguyen et al., proceedings SMRM 1998, page 134. The known method can be used for the in vivo imaging of diffusion phenomena in tissue of a human or animal body to be examined, for example a part of the brain. Diffusion-weighted magnetic resonance (MR) images may be of assistance for making diagnoses of diseases, for example brain infarcts, and for characterizing brain tumors. In order to enable the imaging of diffusion phenomena, the known method also includes a magnetization preparation pulse sequence which includes a gradient pair and a refocusing RF pulse in order to realize an amplitude modulation in the MR signals received, said amplitude modulation being dependent on diffusion of material in the part to be selected in the brain of the body to be examined. The imaging pulse sequence succeeding the magnetization preparation pulse sequence yields navigator MR signals and MR signals wherefrom the MR image of the part of the tissue is reconstructed. MR signals are measured along the number of lines in the k-space as a result of the generation of RF pulses and the application of magnetic field gradients. Repeating the imaging pulse sequence ensures that the imaging MR signals are measured along a number of lines in the k-space which is large enough to ensure that diagnostically useful MR images become available after reconstruction. The applied gradients serve for slice selection, phase encoding and frequency encoding of the MR signals. After all imaging MR signals have been measured, the MR image of the part of the brain to be examined is reconstructed from the measured imaging MR signals while utilizing, for example a two-dimensional Fourier transformation. Subsequently, an imaging quality of the reconstructed MR image is determined. According to the known method an imaging quality of this kind is determined from a ratio of a mean value of intensities of pixels within a boundary of an imaged part of the object to a mean value of intensities of pixels within a boundary of a ghost image of the imaged part of the object. In the context of the present patent application a ghost image is to be understood to mean an image of the imaged part which has been shifted relative to the image and has a lower intensity. If the imaging quality is too low, according to the known method the MR image is corrected by replacing at least one of the measured imaging MR signals by an MR signal to be newly measured for said imaging MR signal, a magnitude of the associated navigator MR signal being smaller than or equal to the magnitudes of the navigator MR signals associated with the other measured imaging MR signals. The imaging MR signal to be measured anew is measured along the same trajectory in the k-space as that along which the imaging MR signal to be replaced has been measured. Subsequently, a new MR image is reconstructed again from the imaging MR signals and the imaging quality of this new MR image is determined again. Subsequently, said steps are repeated until the imaging quality of the MR image is satisfactory.

It is a drawback of the known method that the imaging quality of the MR image is determined after the final reconstruction. It is a further drawback that the imaging quality cannot be unambiguously defined, because the boundary of the imaged part of the object and the boundary of its ghost image can be determined from the reconstructed MR image only afterwards.

Citation of a reference herein, or throughout this specification, is not to construed as an admission that such reference is prior art to the Applicant's invention of the invention subsequently claimed.

SUMMARY OF THE INVENTION

It is an object of the invention to provide a method whereby the imaging quality of the MR image is defined in advance. To this end, the method according to the invention is characterized in that it includes a step in which, prior to the reconstruction of the MR image, a quality criterion of the measured navigator MR signal is compared with a predetermined limit value, followed, if the quality criterion of the measured navigator MR signal does not meet the predetermined limit value, by the step for measuring the at least one of the imaging MR signals again in order to correct the MR image, the latter step being executed by executing the imaging pulse sequence again, the navigator MR signal and the imaging MR signals then being measured again along the first number of lines in the k-space.

The invention is based on the recognition of the fact that by imposing the quality criterion on the measured navigator MR signal it is ensured that the measured imaging MR signals, wherefrom ultimately the MR image is reconstructed, a priori satisfy predetermined requirements and that the MR image always has a predetermined quality after reconstruction. As opposed to the known method, therefore, a quality criterion is not determined afterwards from the reconstructed MR image. When, for example a magnitude of the navigator MR signal is chosen as the quality criterion of the navigator MR signal, the magnitude of the navigator MR signal of an object in motion will be small relative to the magnitude of a navigator MR signal of a stationary object and the imaging MR signals associated with the navigator MR signal will have to be measured again. In that case the MR image will contain fewer motion artefacts. It is a further advantage that the number of successive reconstructions is reduced to a single reconstruction; this offers a saving in time and also reduces the overall acquisition time during which the body to be examined must remain in a magnetic resonance imaging device. A further advantage resides in the fact that, after completion of the measurements, there are also present navigator MR signals which satisfy the predetermined quality criterion and hence all navigator MR signals can be used for a phase correction of the imaging MR signals.

A special version of the method according to the invention is characterized in that the quality criterion is dependent on the magnitude of the measured navigator MR signal. The magnitude of the navigator MR signal can thus be quickly determined. Preferably, the measured navigator MR signal is corrected for eddy-currents. Such eddy-currents are caused by the switching of gradient fields. If no steps are taken, these eddy-currents may deteriorate the MR navigator signal which is acquired from the center of k-space. Notably, compensation for slowly decaying eddy-currents, e.g. having a life time of about 10 ms or more, yields accurate results.

A further version of the method according to the invention is characterized in that the quality criterion is dependent on a modulus-weighted phase of the measured navigator MR signal. The modulus-weighted phase is a weighted mean value of the phases of successive samples of the navigator MR signal weighted by the modulus of the corresponding samples of the navigator MR signal.

A further version of the method according to the invention is characterized in that a corrected MR image is determined by phase correction of the measured MR signals, the phase correction of a sample of the measured MR signal being dependent on the phases of corresponding samples of the navigator MR signal associated with the measured MR signals and a previously measured reference navigator MR signal. The phases of the measured imaging MR signals are thus corrected prior to the reconstruction of the MR image. A phase correction of this kind is known per se from inter alia international patent application IB98/00417.

A further version of the invention is characterized in that the imaging pulse sequence includes a step for generating a magnetization preparation pulse sequence. For example, a diffusion-weighted MR image can thus be obtained.

A further version of the invention is characterized in that the magnetization preparation pulse sequence includes a gradient pair and a first refocusing RF pulse in order to obtain a diffusion-weighted MR image. In the context of the present patent application a gradient pair is to be understood to mean a pair of gradients which have the same direction and whose time integrals are equal.

A further version of the invention is characterized in that after the magnetization preparation pulse sequence a second refocusing RF pulse is generated in the imaging pulse sequence. As a result, the transverse relaxation time $T_2$ is measured instead of the time constant $T^*_2$ of the free induction decay signal.

A further version of the invention is characterized in that the predetermined limit value is dependent on a b value which is dependent on the magnetization preparation pulse sequence and the mean diffusion coefficient of the object to be imaged. A limit value can thus be simply determined after a single reference measurement preceding the actual measurement.

Hence, the limit value may vary from patient to patient. Preferably the reference measurement is carried out so as to yield an average value of the mean diffusion coefficient for the patient at issue. Then the influence of variations of the mean diffusion coefficient on the limit value is reduced.

The invention also relates to a magnetic resonance device for the imaging of an object to be examined which is arranged in a steady magnetic field, which device includes:
  means for sustaining a steady magnetic field,
  means for applying gradients,
  means for generating RF pulses to be applied to the object to be examined in the steady magnetic field,
  a control unit for controlling the application of gradients and the generation of RF pulses, and means for receiving and sampling magnetic resonance signals which are generated by pulse sequences which include the RF pulses and the gradients, said control unit also being arranged to execute the following steps in order to generate an imaging pulse sequence:
    generating an excitation RF pulse,
    measuring a navigator MR signal and imaging MR signals, which imaging MR signals are measured along a first number of lines in the k-space by application of gradients, the control unit also being arranged to execute the following steps:
      reconstructing an MR image from the imaging MR signals of the measured navigator MR signals, and
      correcting the MR image by measuring at least one of the imaging MR signals again.

The device according to the invention is characterized in that the control unit is also arranged to compare, prior to the reconstruction of the MR image, a quality criterion of the measured navigator MR signal with a predetermined limit value and to execute, if the quality criterion of the measured navigator MR signal does not meet the predetermined limit value, the step for measuring the at least one of the imaging MR signals again in order to correct the MR image by executing the imaging pulse sequence again, the navigator MR signal and the imaging MR signals then being measured again along the first number of lines in the k-space.

BRIEF DESCRIPTION OF THE DRAWING

These and other aspects of the invention are apparent from and will be elucidated, by way of non-limitative example, with reference to the embodiments described hereinafter and the accompanying drawing.

In the drawing.

DETAILED DESCRIPTION OF THE PREFERRED EMBODIMENT

Figure 1:
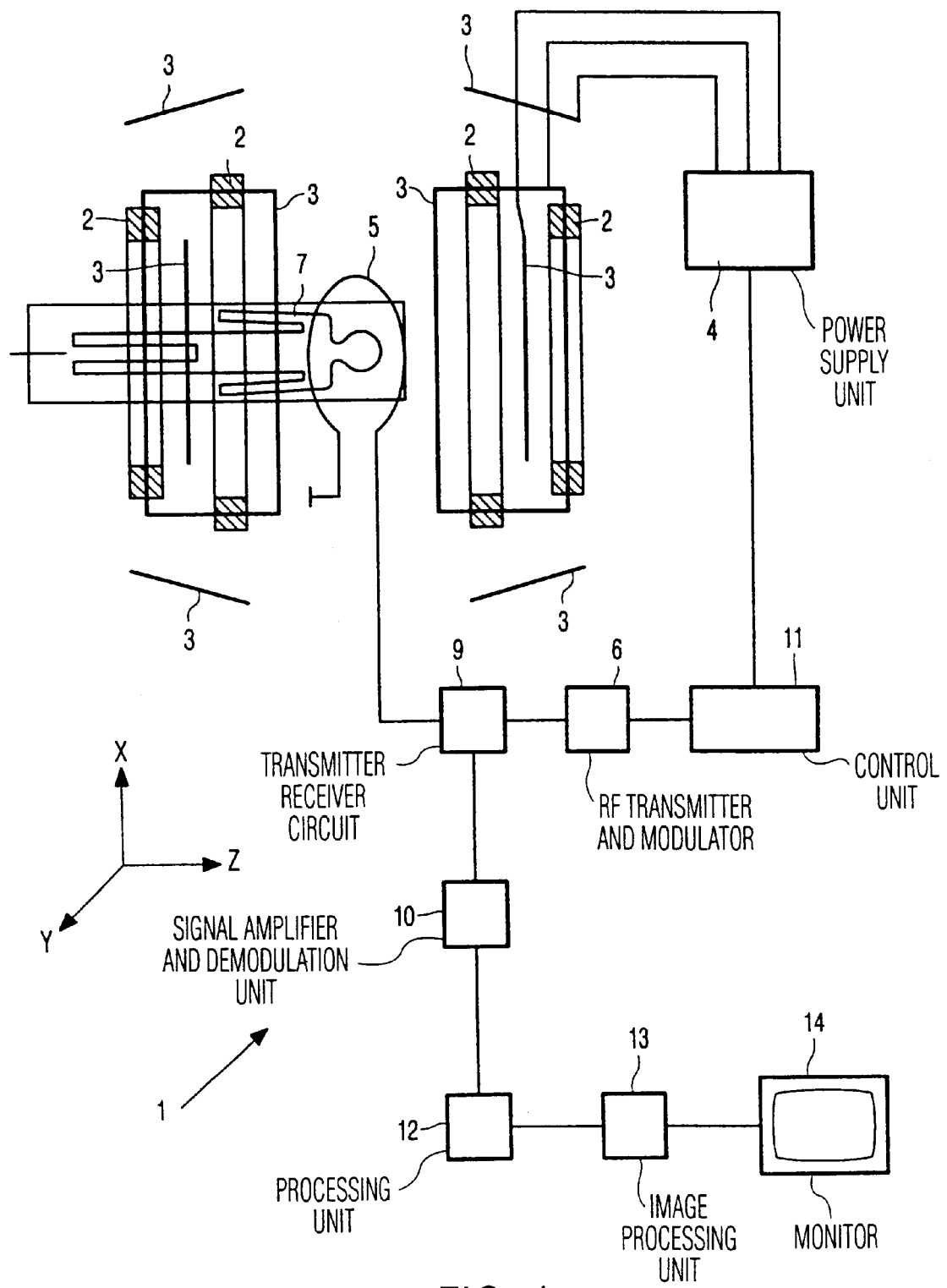
FIG. 1 shows a magnetic resonance device.

FIG. 1 shows a magnetic resonance imaging device which includes a first magnet system 2 for generating a steady magnetic field and also various gradient coils 3 for generating additional magnetic fields which are superposed on the steady magnetic field and cause a gradient in three respective orthogonal directions of a system of co-ordinates X, Y, Z in the steady magnetic field. By convention the Z direction of the system of co-ordinates shown corresponds to the direction of the steady magnetic field in the magnet system 2. A measuring co-ordinate system x, y, z (not shown) to be used can be chosen independently of the X, Y, Z co-ordinate system shown in FIG. 1. Generally speaking, a gradient in the x direction is referred to as a read-out gradient, a gradient in the y direction as a phase encoding gradient and a gradient in the z direction as a selection gradient. The gradient coils 3 are fed by the power supply unit 4. The MRI device also includes an RF transmitter coil 5. The RF transmitter coil 5 serves to generate RF magnetic fields and is connected to an RF transmitter and modulator 6. A receiver coil is used to receive the magnetic resonance signal generated by the RF field in the object 7 to be examined in vivo, or in a part of the object, for example a human or animal body. The receiver coil may be the same coil as the RF transmitter coil 5. The magnet system 2 furthermore encloses an examination space which is large enough to accommodate a part of the body 7 to be examined. Within this examination space the RF transmitter coil 5 is arranged around or on a part of the body 7 to be examined. Via a transmitter-receiver circuit 9, the RF transmitter coil 5 is connected to a signal amplifier and demodulation unit 10. A control unit 11 controls the RF transmitter and modulator 6 and the power supply unit 4 in order to generate special imaging pulse sequences which include RF pulses and gradients. The phase and amplitude obtained from the demodulation unit 10 are applied to a processing unit 12. The processing unit 12 processes the received signal values so as to form an MR image, for example by means of a two-dimensional Fourier transformation. An image processing unit 13 visualizes the MR image via a monitor 14. The invention will be described in detail with reference to the pulse sequence shown in FIG. 2.

Figure 2:
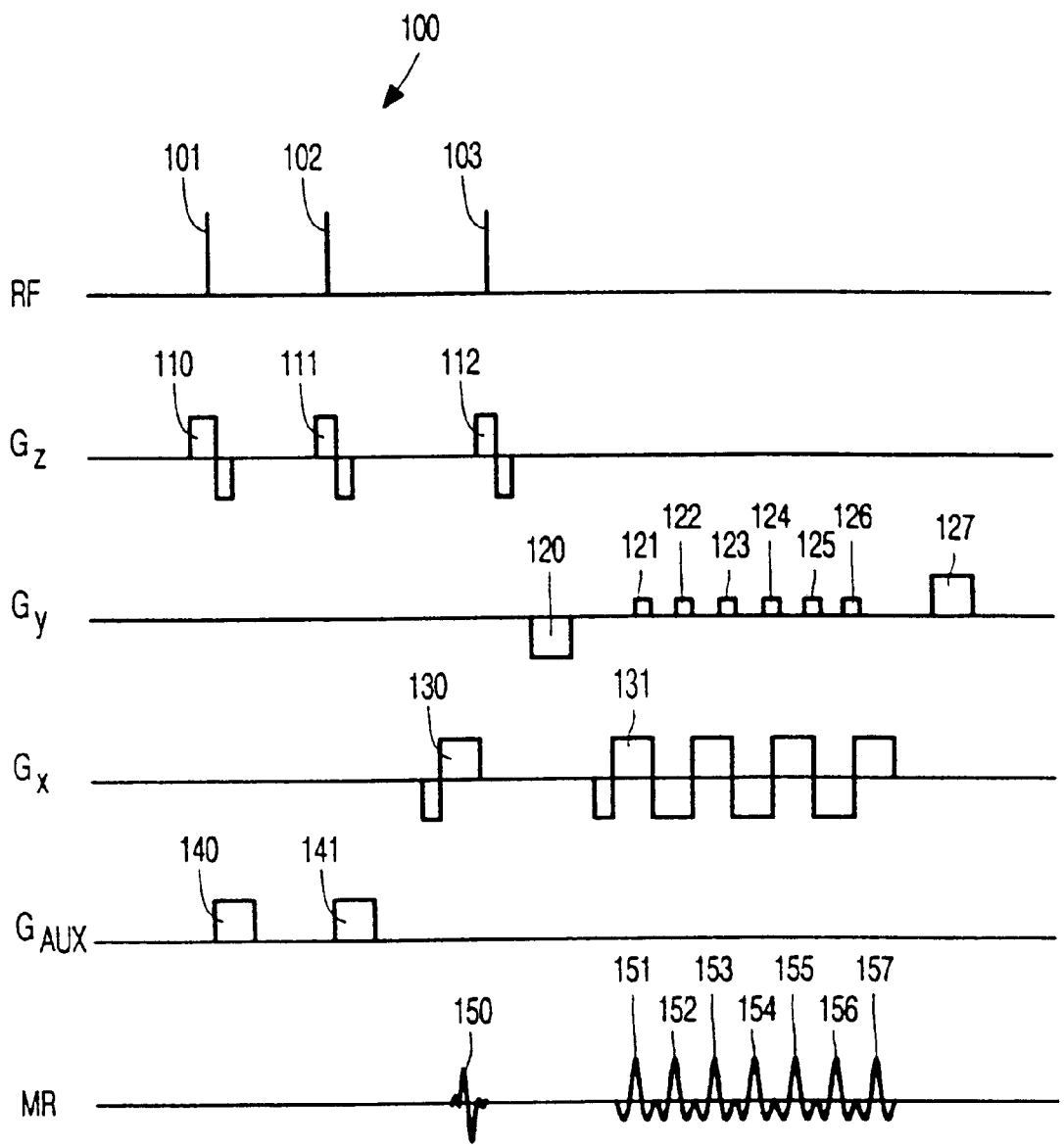
FIG. 2 shows an example of an imaging pulse sequence.

FIG. 2 shows a pulse sequence 100 which is used, in a first version of the method, for example, to form an in vivo MR image of, for example diffusion of material, for example intracellular fluid, in a part of the brain of the body to be examined. In FIG. 2 the time is plotted from left to right and the various rows indicate the temporal relationship between the RF pulses to be generated, the gradients to be applied, and the MR signals to be measured. The upper row, denoted by the reference RF, shows the RF pulses to be generated; the three rows therebelow, denoted by the references $G_x$, $G_y$, $G_z$, $G_{aux}$, show the gradients in the x, the y and the z direction, respectively, and in a direction in which the diffusion of material is measured. The row situated therebelow, denoted by the reference MR, shows the MR signals to be measured.

The imaging pulse sequence 100 includes an excitation RF pulse 101, selection gradients 110, 111, 112, and a magnetization preparation pulse sequence 140, 102, 141, an initial phase encoding gradient 120, phase encoding gradients 121 to 126, a navigator read-out gradient 130, a read-out gradient 131 and a rephasing gradient 127.

The imaging pulse sequence 100 commences with the generating of the excitation RF pulse 101. The flip angle of the excitation RF pulse preferably amounts to 90 degrees. Furthermore, a selection gradient 110 is applied upon the generating of the excitation RF pulse 101. As a result, the excitation RF pulse 101 excites spins in a selected slice of the brain of the body to be examined. Subsequently, the magnetization preparation pulse sequence 140, 102, 141 is applied so as to render the magnetization present in the selected part dependent on the diffusion in the selected part of the brain. The magnetization preparation pulse sequence includes a gradient pair 140, 141 and a first refocusing RF pulse 102. The gradient pair includes two additional gradients 140, 141 which are successively applied, the first refocusing RF pulse 102 being generated temporally between the additional gradients 140, 141. The time integral of the two gradients 140, 141 is the same. Instead of the gradient pair 140, 141 and a first refocusing RF pulse 102, use can also be made of a bipolar gradient pair, the time integrals of the gradients then being equal but their directions being opposed. In that case the first refocusing RF pulse 102 can be dispensed with. The first refocusing RF pulse 102 is rendered slice selective by application of a second selection gradient 111 which has the same properties as the first selection gradient 110. The flip angle of the first refocusing RF pulse 102 preferably amounts to 180 degrees. The magnetization preparation pulse sequence 140, 102, 141 is characterized by a b value which is defined by $$b = \gamma^2 \delta^2 \left(\Delta - \frac{1}{3}\delta\right) G^2 \quad (1)$$

in which

δ represents the duration of the applied additional gradient,

Δ represents the diffusion time between the application of the successive additional gradients, γ represents the gyromagnetic constant, and G represents the strength of the additional gradient.

After the magnetization preparation pulse sequence 140, 101, 141, a navigator MR signal 150 is measured by application of a navigator read-out gradient 130. The direction of the navigator read-out gradient 130 corresponds to that of a read-out gradient 131 applied so as to measure the imaging MR signals 151 to 157. Subsequently, preferably a second refocusing RF pulse 103 is applied in order to measure the transverse relaxation time instead of the time constant $T^*_2$ of the free induction decay signal. The second refocusing RF pulse 103 is rendered slice selective by application of a third selection gradient 112. The flip angle of the second refocusing RF pulse 103 also amounts to 180 degrees. Subsequently, the initial phase encoding gradient 120, the phase encoding gradients 121 to 126 and the alternating read-out gradient 131 are applied, said gradients being analogous to those used in an Echo Planar Imaging (EPI) pulse sequence. The EPI pulse sequence is known from the book "Magnetic Resonance Imaging", published by M. T. Vlaardingerbroek et al., 1995, page 123. Subsequently, the initial phase encoding gradient 120 is applied in order to execute the EPI pulse sequence. Moreover, further phase encoding gradients 121 to 126 are applied near the second and subsequent zero crossings of the alternating read-out gradient 131 in such a manner that the k-space is traversed along the first number of lines. The imaging MR signals 151 to 157 are measured in the presence of the alternating read-out gradient 131. After application of the read-out gradient 131, a rephasing gradient 127 is applied so as to eliminate the phase encoding introduced. The imaging pulse sequence 100 is repeated for different values of the initial phase encoding gradients 120 and the rephasing gradients 127 in such a manner that a complete set of imaging MR signals is measured along, for example, 256 lines in the k-space, the lines in the k-space preferably being situated parallel to the $k_x$ axis. The number of imaging MR signals measured in a single imaging pulse sequence amounts to, for example 8. Subsequently, on the basis of the measured set of imaging MR signals the processing unit 12 reconstructs a diffusion-weighted MR image of the selected slice of the brain of the body to be examined. In order to avoid imaging artefacts due to motional unsharpness, according to the invention a magnitude $A_i$ of the navigator MR signal 150 is determined after the execution of an imaging pulse sequence 100 in which the navigator MR signal 150 and the first number of imaging MR signals 151 to 157 are measured. Subsequently, this magnitude $A_i$ is compared with a predetermined limit value $T_m$. If the magnitude $A_i$ is smaller than the limit value $T_m$, the imaging pulse sequence 100 is executed again, the navigator MR signal 150 and the imaging MR signals 151 to 157 then being measured again; the imaging MR signals are then measured along the same lines in the k-space as during the last imaging pulse sequence executed. If the newly determined magnitude $A_i$ of the navigator MR signal 150 is greater than or equal to the limit value, the experiment continues with the imaging pulse sequences for the measurement of navigator MR signals and imaging MR signals along the other lines of the k-space. If the newly determined magnitude $A_i$ is smaller than the limit value $T_m$, the cycle is repeated.

The magnitude of the navigator MR signal is obtained, for example by determining the square sum of the measured amplitudes of the samples of the navigator MR signal.

These steps for determining the quality of the measured imaging MR signals and the possibly repeated measurement of imaging MR signals are carried out after the execution of each imaging pulse sequence. This enables the reconstruction of a diffusion-weighted image with reduced motion artefacts.

The limit value can be determined, for example by executing, prior to the actual experiment, an image pulse sequence 100 in which the b value of the magnetization preparation pulse sequence 140, 102, 141 equals zero and by measuring a reference navigator MR signal 150 associated with this imaging pulse sequence. Subsequently, the magnitude $A_o$ of the reference MR signal 150 is determined in the manner described above.

The limit value $T_m$ for use in subsequent imaging pulse sequences with a b-value of the magnetization preparation pulse sequence which is to be selected by the user is subsequently determined as follows:

$$T_m = c_1 A_0 \exp(-bD_{av})$$

where $T_m$ represents the limit value, $c_1$ represents a coefficient to be selected, $A_0$ represents the magnitude of the reference MR signal for a b value equal to 0, and $D_{ave}$ represents the average diffusion coefficient of the tissue to be imaged.

According to a further possibility for a quality criterion of the measured navigator MR signals, a modulus-weighted phase contains the measured navigator MR signal. This quality criterion is defined as a weighted mean value of the difference between the phases of successive samples of the navigator MR signal and the phases of the corresponding samples of the reference navigator MR signal, weighted by the modulus of the corresponding samples of the reference navigator MR signal. A limit value $T_d$ of this quality criterion for use of the navigator MR signal 150 and the imaging MR signals 151–157 for further processing is, for example zero, or a small value such as 0.1, which can be experimentally determined by a person skilled in the art.

In order to reduce motion artefacts in the diffusion-weighted MR image even further, before carrying out the reconstruction a phase correction can be applied to the set of measured imaging MR signals. This phase correction corrects a phase error caused by a slight motion in the direction of the read-out gradient between the execution of successive imaging pulse sequences. A correction of this kind is described in international patent application IB 98/00417. In order to execute this correction, a one-dimensional Fourier transformation is performed successively on a first and a second navigator MR signal 150 of two successive imaging pulse sequences 100; for example, the first measured navigator MR signal 150 is then used as a reference. In this manner two navigator phase series $\phi_{nav1}(\phi_{nav1}(x))$, $\phi_{nav1}$ ($\phi_{nav2}(x)$) which contain the phase as a function of the position in the direction of the navigator read-out gradient 130 are obtained. Subsequently, a one-dimensional Fourier transformation is performed on the measured imaging MR signals 151 to 157, yielding a measured phase series $\phi_i$ ($\phi_{mr}(x)$). Subsequently, a correction is determined from the navigator phase series $\phi_{nav1}$, $\phi_{nav2}$ in order to correct the phase series $\phi_i$. Preferably, a non-linear phase correction is applied; this correction is determined by $$\phi_{mr0}(x) = \phi_{mr1}(x) + (\phi_{nav2}(x) - \phi_{nav1}(x)) \tag{3}$$

where $\phi_{mr0}(x)$ represents a corrected phase for a position x in the direction of the read-out gradient, $\phi_{mr1}(x)$ represents the phase of the measured imaging MR signal corresponding to the position x, $\phi_{nav2}(x)$ represents the phase of the measured second navigator MR signal corresponding to the position x, and $\phi_{nav1}(x)$ represents the phase of the measured first navigator MR signal corresponding to the position x.

An EPI pulse sequence is used in the imaging pulse sequence 100 of the described example. However, the described imaging pulse sequence can also be combined with other imaging pulse sequences which are known per se, for example spin echo imaging pulse sequences, Turbo Spin Echo (TSE) imaging pulse sequences, and Gradient And Spin Echo (GRASE) imaging pulse sequences which are known inter alia from the cited book "Magnetic Resonance Imaging", published by M. T. Vlaardingerbroek et al., 1995.

The described example relates to the imaging of diffusion phenomena; however, the invention can also be carried out so as to form other MR images without requiring the magnetization preparation pulse sequence 140, 102, 141.

All references cited herein, as well as the priority document European Patent Application 98203985.1 filed Nov. 25, 1998, are incorporated herein by reference in their entirety and for all purposes to the same extent as if each individual publication or patent or patent application was specifically and individually indicated to be incorporated by reference in its entirety for all purposes.

What is claimed is:

1. A method of forming a magnetic resonance image of an object which is arranged in a steady magnetic field, the method comprising:

executing an imaging pulse sequence comprising
generating an excitation RF pulse,
measuring a navigator MR signal and imaging MR signals, which imaging MR signals are measured along a determined number of lines in the k-space by application of gradients, comparing a quality criterion of the measured navigator MR signal with a predetermined limit value, executing again the imaging pulse sequence to measure again the determined number of lines in k-space in order to correct an MR image if the quality criterion of the measured navigator MR signal does not meet the predetermined limit value, and reconstructing the MR image from the measured imaging MR signals.

2. A method as claimed in claim 1 wherein the quality criterion is dependent on the magnitude of the navigator MR signal.

3. A method as claimed in claim 2 wherein the quality criterion is dependent on a modulus-weighted phase of the measured navigator MR signal.

4. A method as claimed in claim 2 further comprising a step for determining a corrected MR image by phase correction of the measured MR signals, the phase correction of a sample of the measured MR signal being dependent on the phases of corresponding samples of the navigator MR signals which are associated with the measured MR signals and have been measured in the same imaging pulse sequence as the measured MR signals, and a previously measured navigator MR signal.

5. A method as claimed in claim 1 wherein the imaging pulse sequence further comprises, before the step of measuring, a step for generating a magnetization preparation pulse sequence.

6. A method as claimed in claim 5 wherein the magnetization preparation pulse sequence comprises a gradient pair and a first refocusing RF pulse in order to obtain a diffusion-weighted MR image.

7. A method as claimed in claim 5 wherein the imaging pulse sequence further comprises, after the step of generating the magnetization preparation pulse sequence, a step for generating a second refocusing RF pulse.

8. A method as claimed in claim 5 wherein the predetermined limit value is dependent on a b value adjusted for the magnetization preparation pulse sequence and on a mean diffusion coefficient of the object to be imaged.

9. A method of forming a magnetic resonance image of an object as claimed in claim 1 wherein the imaging pulse sequence further comprises applying an eddy-current compensation to the measured navigator MR signal.

10. A magnetic resonance device for imaging an object to be examined which is arranged in a steady magnetic field comprising:

means for sustaining the steady magnetic field, means for applying gradients, means for generating RF pulses to be applied to the object to be examined in the steady magnetic field, a control unit for controlling the application of gradients and the generation of RF pulses, and means for receiving and sampling magnetic resonance signals which are generated by pulse sequences which include the RF pulses and the gradients, wherein said control unit is also arranged to perform the following steps executing an imaging pulse sequence comprising generating an excitation RF pulse, measuring a navigator MR signal and imaging MR signals, which imaging MR signals are measured along a determined number of lines in the k-space by application of gradients, comparing a quality criterion of the measured navigator MR signal with a predetermined limit value, executing again the imaging pulse sequence to measure again the determined number of lines in k-space in order to correct an MR image if the quality criterion of the measured navigator MR signal does not meet the predetermined limit value, and reconstructing the MR image from the measured imaging MR signals.

* * * * *